United States Patent
Gros D'aillon et al.

(10) Patent No.: US 9,397,128 B2
(45) Date of Patent: Jul. 19, 2016

(54) PROCESS FOR FORMING A STACK OF DIFFERENT MATERIALS, AND DEVICE COMPRISING THIS STACK

(71) Applicants: STMicroelectronics SA, Montrouge (FR); Commissariat A L'Energie Atomique et aux Energies Alternatives, Paris (FR)

(72) Inventors: Patrick Gros D'aillon, Biviers (FR); Michel Marty, Saint Paul d Varces (FR)

(73) Assignee: STMicroelectronics SA, Montrouge (FR)

( * ) Notice: Subject to any disclaimer, the term of this patent is extended or adjusted under 35 U.S.C. 154(b) by 2 days.

(21) Appl. No.: 14/503,460

(22) Filed: Oct. 1, 2014

(65) Prior Publication Data

US 2015/0091116 A1    Apr. 2, 2015

(30) Foreign Application Priority Data

Oct. 2, 2013 (FR) .................................. 13 59540

(51) Int. Cl.
*H01L 27/146* (2006.01)
*G02B 5/20* (2006.01)
*G02B 5/28* (2006.01)
*H04N 9/04* (2006.01)

(52) U.S. Cl.
CPC ......... *H01L 27/14621* (2013.01); *G02B 5/20* (2013.01); *G02B 5/281* (2013.01); *G02B 5/286* (2013.01); *G02B 5/288* (2013.01); *H01L 27/14685* (2013.01); *H04N 9/045* (2013.01)

(58) Field of Classification Search
CPC .............. H01L 31/02162; H01L 31/02164; H01L 31/02165

USPC ........................................................ 257/432
See application file for complete search history.

(56) References Cited

U.S. PATENT DOCUMENTS 5,053,832 A * 10/1991 Uchida ................. H01L 45/00
257/4
5,242,740 A * 9/1993 Rostaing ............... C23C 16/345
351/159.62
8,008,695 B2 * 8/2011 Rhodes ............. H01L 27/14609
257/291

(Continued)

OTHER PUBLICATIONS

Lelievre et al., Study of the composition of hydrogenated silicon nitride SiNx:H for efficient surface and bulk passivation of silicon, Solar Energy Materials & Solar Cells, 93, 2009, pp. 1281-1289.*

(Continued)

*Primary Examiner* — Earl Taylor
(74) *Attorney, Agent, or Firm* — Gardere Wynne Sewell LLP

(57) ABSTRACT

A stack of layers defines a filter and is formed by copper on hydrogenated silicon nitride supported by a carrier. The filter includes a layer of hydrogenated silicon nitride, a layer of silicon oxide on the layer of hydrogenated silicon nitride and a layer of copper on the layer of silicon oxide. The layer of hydrogenated silicon nitride may have, in a vicinity of its upper side, a ratio of a number of silicon atoms per cubic centimeter to a number of nitrogen atoms per cubic centimeter lower than 0.8 (or even lower than 0.6), with a number of silicon-hydrogen bonds smaller than or equal to $6\times10^{21}$ bonds per cubic centimeter (or even smaller than $0.5\times10^{21}$ bonds per cubic centimeter). The filter further includes an additional layer of copper between the layer of hydrogenated silicon nitride and the carrier.

24 Claims, 2 Drawing Sheets

(56) References Cited

U.S. PATENT DOCUMENTS

| | | | |
|---|---|---|---|
| 8,053,856 B1* | 11/2011 | Tu | H01L 27/14609 257/414 |
| 2011/0001207 A1* | 1/2011 | Takase | H01L 27/14621 257/432 |
| 2011/0018079 A1* | 1/2011 | Pain | H01L 27/1463 257/432 |
| 2011/0062540 A1* | 3/2011 | Saito | H01L 27/14609 257/432 |
| 2011/0175187 A1* | 7/2011 | Ueno | H01L 27/1462 257/437 |
| 2012/0091549 A1* | 4/2012 | Chou | H01L 27/14685 257/432 |
| 2013/0075851 A1* | 3/2013 | Terai | H01L 27/14621 257/432 |
| 2013/0113061 A1* | 5/2013 | Lai | H01L 27/1463 257/432 |
| 2013/0134536 A1* | 5/2013 | Mori | H01L 27/1462 257/432 |
| 2015/0035106 A1* | 2/2015 | Carrere | H01L 27/14625 257/432 |
| 2015/0091116 A1* | 4/2015 | Gros D'aillon | G02B 5/20 257/432 |
| 2015/0101662 A1* | 4/2015 | Seutter | H01L 31/1864 136/256 |
| 2015/0171240 A1* | 6/2015 | Kapur | H01L 31/022441 438/72 |

OTHER PUBLICATIONS

Pastorino et al., Amorphous Hydrogenated Silicon Nitride Deposited by Mercury Photosensitization Chemical Vapour Deposition for Optoelectronic Applications, Journal de Physique IV, May 1995, (C5), pp. C5-1149-C51155.*

Debieu et al., Structural and optical characterization of pure Si-rich nitride thin films, Nanoscale Research Letters, 8:31, 2013, pp. 1-13.*

INPI Search Report and Written Opinion for FR 1359540 dated May 20, 2014 (7 pages).

* cited by examiner

PROCESS FOR FORMING A STACK OF DIFFERENT MATERIALS, AND DEVICE COMPRISING THIS STACK

PRIORITY CLAIM

This application claims priority from French Application for Patent No. 1359540 filed Oct. 2, 2013, the disclosure of which is incorporated by reference.

TECHNICAL FIELD

Methods of implementation and embodiments of the invention relate to the formation of stacks of different materials, for example in integrated circuits, particularly for forming optical filters that are intended to filter (i.e., to let through) various light rays in a desired wavelength range, in particular in the visible or infrared domain, and that are used in imaging devices.

BACKGROUND

Imaging devices generally comprise a set of pixels each having a photosensitive semiconductor region arranged under an integrated optical filter, a color filter for example. In particular it is possible to use groups of pixels with red, green or blue filters, so as to form Bayer patterns well known to those skilled in the art.

Optical filters intended to allow only a single color through generally comprise an organic filter colored by pigments. These filters have the drawback of not being sufficiently robust, and of not being usable for infrared wavelengths.

These filters also have the drawback of being degraded when they are exposed to temperatures exceeding 200° C.

Alternatives to filters colored by pigments have therefore been proposed.

From the prior art, optical filters comprising metal layers in which features are formed with dimensions of the order of a nanometer, are known. In this respect, the reader may refer to the document "Color filter based on a subwavelength patterned metal grating" (Hong-Sik Lee, et al., Optics Express, Vol. 15, Issue 23, 2007, hereby incorporated by reference) which describes such optical filters.

Resonant optical filters for filtering one wavelength are also already known. These resonant optical filters comprise a layer of a dielectric material, generally arranged between two electrodes to form filters. The properties of the materials used to form the electrodes and the layer of dielectric material determine the resonant frequency of the resonator and therefore also the wavelength of the photons that may pass through the filter to reach a photosensitive region arranged under the filter. The resonant effect obtained in particular depends on variations in thickness and in refractive index between the electrodes and the dielectric layer. These resonators may be filters intended to let through visible colors or even infrared and ultraviolet radiation. They may in particular be arranged above imaging devices or sensors such as single photon avalanche photodiodes.

The reader may refer to document WO 2005/069376, incorporated herein by reference, which describes an imaging device comprising filters having different thicknesses for filtering various colors. The filters described in this document use materials that are not generally used for the fabrication of integrated circuits.

SUMMARY

According to one method of implementation and embodiment, a process is proposed for forming a stack, and a device comprising a stack, the stack being more robust, especially in terms of mechanical strength and longevity, than organic filters colored by pigments, this stack furthermore being formed with materials customarily available for the fabrication of integrated circuits.

The inventors have observed that it is possible to form stacks containing layers of copper on layers of hydrogenated silicon nitride ($Si_xN_yH$), amorphous hydrogenated silicon nitride for example, by choosing the values of formation parameters of these layers, whereas, in the prior art, it was not possible to form such stacks without delamination occurring between the layers during additional heat treatments.

Moreover, the use of barrier layers comprising tantalum and tantalum nitride and deposited prior to the layers of copper to ensure their adherence is not possible in stacks intended to form optical filters. This is because these barrier layers may produce interference in multi-layer optical filters (of the Fabry-Perot type).

According to one aspect, a process is proposed for forming a stack at least including copper on hydrogenated silicon nitride, for example amorphous hydrogenated silicon nitride, the process comprising: formation of a layer of hydrogenated silicon nitride having, in the vicinity of its upper side, for example in a thickness of about 50 nanometers, a ratio of the number of silicon atoms per cubic centimeter to the number of nitrogen atoms per cubic centimeter lower than 0.8, or preferably lower than 0.6; formation of a layer of silicon oxide on the layer of hydrogenated silicon nitride; and formation of a layer of copper on the layer of silicon oxide.

When a layer of copper is formed on a layer of hydrogenated silicon nitride without using a layer comprising tantalum or tantalum nitride, delamination generally occurs under the stress in the layers.

To promote the adherence of the layer of copper, it has been discovered that it is possible to form a layer of silicon oxide before forming the layer of copper, in order to promote the adherence of the copper. Furthermore, it has been discovered, in a surprising way, that copper adheres to a layer of silicon oxide formed on a layer of hydrogenated silicon nitride comprising a large amount of nitrogen.

The nitrogen makes it possible to obtain a layer of silicon oxide by atmospheric oxidization, the oxidization being implemented by attracting water molecules present in the atmosphere. The silicon oxide thus formed is, for example, non-stoichiometric with a number of oxygen atoms per silicon atom smaller than 2.

With a low ratio of the number of silicon atoms per cubic centimeter to the number of nitrogen atoms per cubic centimeter (i.e., lower than 0.8 or preferably lower than 0.6) a good layer of silicon oxide is obtained, which will enable the layer of copper to adhere.

Those skilled in the art will be able to choose the formation parameters of the layer of hydrogenated silicon nitride to obtain these values, for example by minimizing the ratio of the amount of silane ($SiH_4$) to the amount of ammonia ($NH_3$) used as precursor gases for the deposition.

When layers of hydrogenated silicon nitride, amorphous hydrogenated silicon nitride for example, are formed, a plasma-enhanced chemical vapor deposition process is generally used. Mixtures of gas are then used to form the layers of hydrogenated silicon nitride, and these mixtures may include silane ($SiH_4$) and ammonia ($NH_3$).

It has been discovered, in a surprising way, that the presence of large amounts of hydrogen (due to the precursor gases used for the deposition) inside the layer of hydrogenated silicon nitride may decrease bonding energy between the layer of hydrogenated silicon nitride and the layer of copper.

This is because the hydrogen, which may be present in the form of silicon-hydrogen bonds, can escape in the form of gas when temperature is subsequently raised.

Therefore, by decreasing the number of silicon-hydrogen bonds, delamination under stress is prevented, for example during subsequent fabrication steps involving temperature rises.

Even though it is preferable to have zero silicon-hydrogen bonds, it is particularly difficult to obtain zero bonds because of the gases used. However, a good stack is obtained with a number of bonds smaller than or equal to $6\times10^{21}$, or even smaller than or equal to $0.5\times10^{21}$ bonds per cubic centimeter.

It is therefore possible to form a layer of hydrogenated silicon nitride having, in the vicinity of its upper side (for example, in a thickness of about 50 nanometers) a number of silicon-hydrogen bonds smaller than or equal to $6\times10^{21}$ bonds per cubic centimeter, or preferably smaller than or equal to $0.5\times10^{21}$ bonds per cubic centimeter.

Those skilled in the art will be able to choose the formation parameters of the layer of hydrogenated silicon nitride, in order to decrease the number of silicon-hydrogen bonds, especially the proportions of the gases used, the pressure in the deposition chamber and the power used to ionize the deposition precursor gases.

It is possible to form a layer of hydrogenated silicon nitride having, in the vicinity of its upper side, for example in a thickness of the order of a nanometer, compressive mechanical stresses having an intensity in absolute value higher than or equal to 1 GPa.

The stack obtained is thus more robust, because it withstands increases in stresses induced by temperature rises. Specifically, copper and hydrogenated silicon nitride have different thermal expansion coefficients. During a rise in temperature, the layer of hydrogenated silicon nitride is able to withstand mechanical stresses related to the expansion of the copper without delaminating.

The use of a layer of hydrogenated silicon nitride having high compressive mechanical stresses is particularly advantageous for stacks arranged in integrated circuits, for which subsequent fabrication steps may involve implementing temperature rises.

It should also be noted that the materials used here are materials conventionally used in integrated-circuit fabrication steps.

The formation of the stack may furthermore comprise formation of the layer of hydrogenated silicon nitride on a lower layer of copper.

Those skilled in the art know how to form a layer of hydrogenated silicon nitride on copper. By also forming a layer of copper on the layer of hydrogenated silicon nitride, it is possible to obtain two copper electrodes separated by hydrogenated silicon nitride in order to form a resonant optical filter.

According to another aspect, a device is proposed comprising a stack including: a layer of hydrogenated silicon nitride having, in the vicinity of its upper side, a ratio of the number of silicon atoms per cubic centimeter to the number of nitrogen atoms per cubic centimeter lower than 0.8, or preferably lower than 0.6; a layer of silicon oxide on the layer of hydrogenated silicon nitride; and a layer of copper on the layer of silicon oxide.

The layer of hydrogenated silicon nitride may have, in the vicinity of its upper side, a number of silicon-hydrogen bonds smaller than or equal to $6\times10^{21}$ bonds per centimeter cube, or preferably smaller than or equal to $0.5\times10^{21}$.

The layer of hydrogenated silicon nitride may have, in the vicinity of its upper side, compressive mechanical stresses having an intensity in absolute value higher than or equal to 1 GPa.

The stack may furthermore comprise a lower layer of copper located under the layer of hydrogenated silicon nitride.

The stack may form a resonant optical filter.

According to another aspect, an imager comprising the device mentioned above is proposed.

An imaging device is thus obtained, formed simply with only a small number of different materials and, in particular, no tie layers comprising tantalum or tantalum nitride.

BRIEF DESCRIPTION OF THE DRAWINGS

Other advantages and features of the invention will become apparent on studying the detailed description of methods of implementation and embodiments, given by way of non-limiting example and illustrated by the appended drawings in which.

DETAILED DESCRIPTION OF THE DRAWINGS

Figure 1:
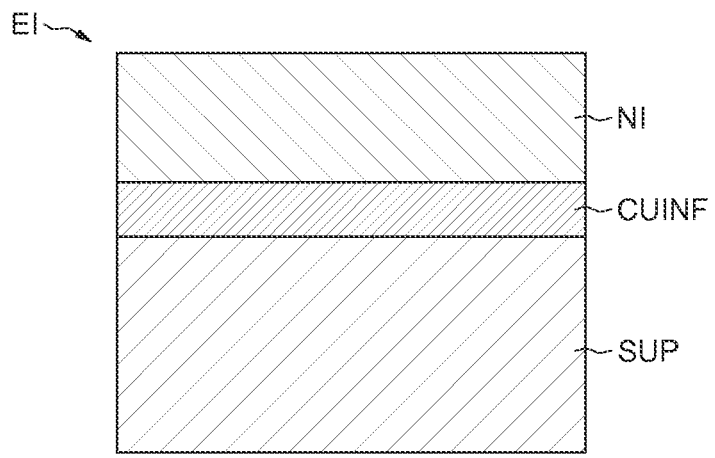
FIGS. 1 to 4 illustrate various steps of a method of implementation of a process for forming a stack, and a stack resulting from the process.

FIG. 1 schematically shows an initial stack EI of layers intended to be completed with at least one layer of copper. By way of indication, this initial stack may be located in an integrated circuit being fabricated.

The initial stack EI comprises, on a carrier SUP, a lower layer of copper CUINF on which a layer of hydrogenated silicon nitride NI has been formed.

The carrier SUP may be a wafer used in microelectronics, or even a region inside an integrated circuit such as the interconnect region well known to those skilled in the art as the BEOL (back end of line) region. The lower layer of copper may for example have a thickness comprised between 5 and 50 nanometers, and the layer of hydrogenated silicon nitride may for example have a thickness comprised between 5 nanometers and several hundred nanometers.

The layer of hydrogenated silicon nitride may be formed by plasma-enhanced chemical vapor deposition. It will in particular be possible to use a mixture of silane and ammonia to form this layer.

The parameters of the step of forming the layer of hydrogenated silicon nitride NI must be chosen so as to obtain a layer having, in the vicinity of its upper side (for example, in a thickness of 50 nanometers) a ratio of the number of silicon atoms per cubic centimeter to the number of nitrogen atoms per cubic centimeter at least lower than 0.8, and preferably a number of silicon-hydrogen bonds at least smaller than or equal to $6\times10^{21}$ bonds per cubic centimeter.

Also, although this is not obligatory, it is preferable to form a layer of hydrogenated silicon nitride NI having, in the vicinity of its surface (for example in the last nanometer), compressive mechanical stresses having an intensity in absolute value at least higher than 1 GPa.

It will be possible to verify these parameters by measurement, by Fourier transform infrared spectroscopy (for wafer-scale deposition), or by time of flight secondary ionization mass spectrometry ("ToF SIMS") or else locally by electronic microscopy associated with energy-dispersive X-ray analysis ("EDX").

Figure 2:
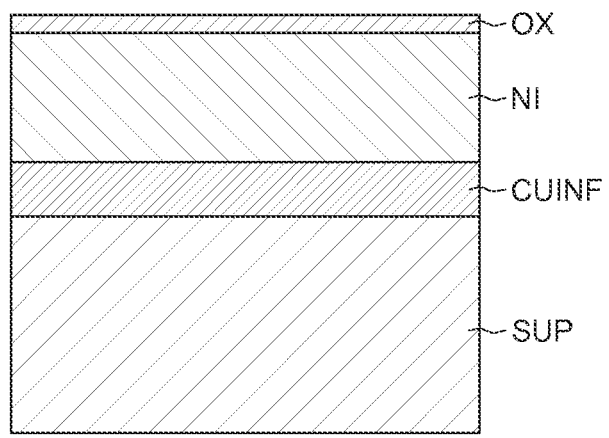

With a high number of nitrogen atoms, it is possible to form a layer of silicon oxide by atmospheric oxidization, as illustrated in FIG. 2, in which a layer of silicon oxide OX has been formed directly on the layer of hydrogenated silicon nitride NI. The layer of silicon oxide may have a small thickness, for example of about 1 to 3 nanometers. It will be possible to measure the thickness of this layer after its formation, for example by studying a cross section of the stack using a transmission electron microscopy process.

Figure 3:
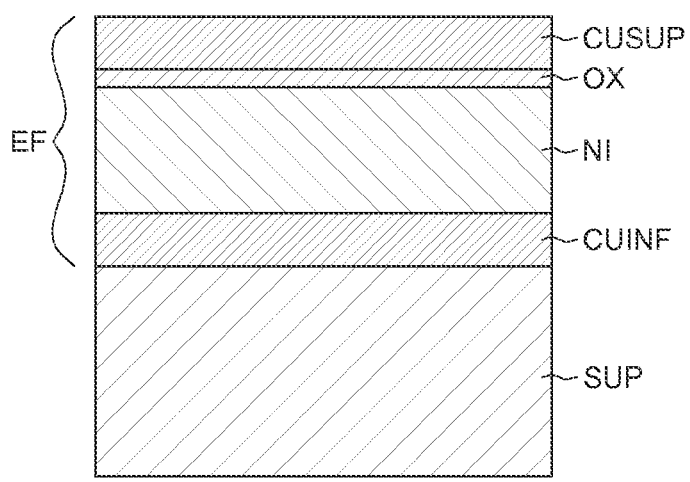

It is then possible to form, by chemical vapor-phase deposition, an upper layer of copper CUSUP on the layer of silicon oxide (FIG. 3).

As may be seen in FIG. 3, a final stack EF is obtained in which the layer of copper is deposited, without a tie layer, directly on a thin layer of silicon oxide OX on a layer of hydrogenated silicon nitride NI.

This final stack EF, incorporated inside a device, such as an imager, includes:
- a layer of hydrogenated silicon nitride NI having, in the vicinity of its upper side, a ratio of the number of silicon atoms per cubic centimeter to the number of nitrogen atoms per cubic centimeter lower than 0.8;
- a layer of silicon oxide OX on the layer of hydrogenated silicon nitride; and
- a layer of copper CUSUP on the layer of silicon oxide.

Figure 4:
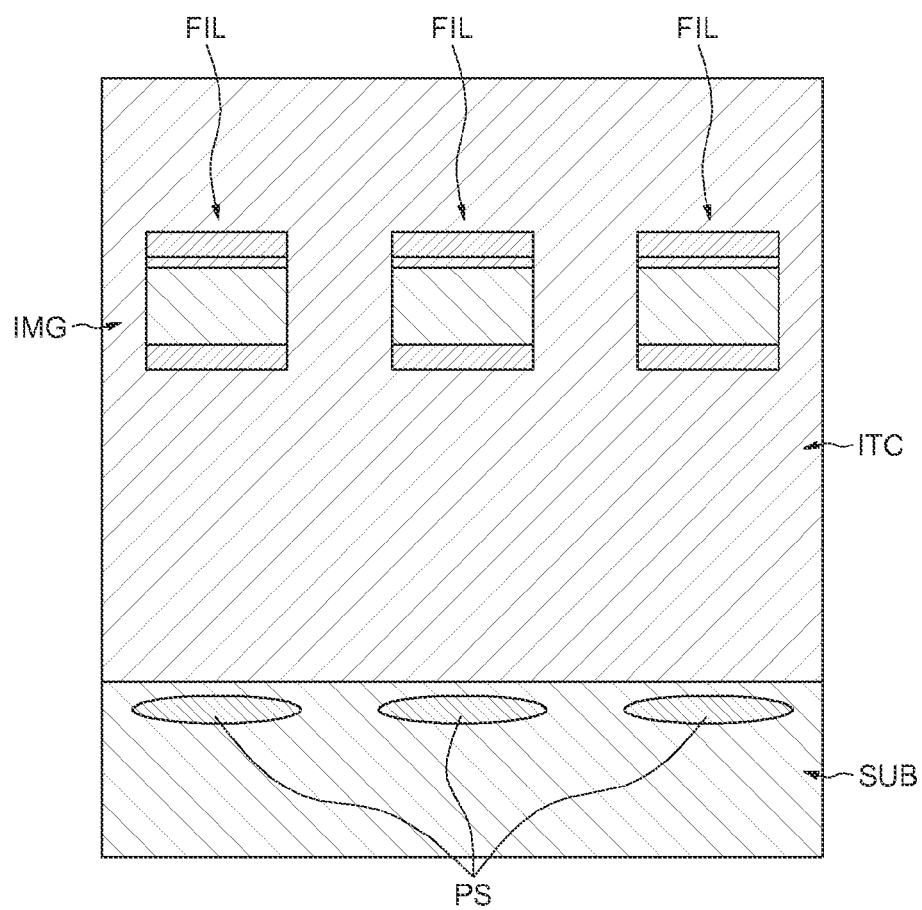

According to one aspect, the resulting structure is applicable to imagers comprising metal resonant filters. FIG. 4 schematically shows an integrated imager comprising a plurality of photosensitive regions PS (for example, avalanche photodiode junctions). The photosensitive regions PS may be formed in a substrate SUB made of silicon.

Above the substrate SUB, a BEOL-type interconnect part ITC has been formed. In this interconnect part ITC, above each photosensitive region PS, a resonant optical filter FIL has been formed. Each filter FIL may comprise a stack similar to the stack EF described with reference to FIG. 3.

An optical filter is therefore obtained formed solely with materials that are easy to use for the fabrication of integrated circuits.

It will be noted that the layer of silicon oxide formed on the hydrogenated silicon nitride is thin enough (between 1 and 5 nanometers by atmospheric oxidization) not to produce optical interference in the formed filter, unlike layers of tantalum or tantalum nitride which reduce the transmission of photons.

It should be noted that it is not necessary to arrange any barrier layers around the layers of copper to prevent diffusion of copper atoms.

According to one aspect, a process is obtained that allows an adherent layer of copper to be formed above a layer of hydrogenated silicon nitride (amorphous hydrogenated silicon nitride, for example) using a small number of different materials.

It is also now possible to form optical filters simply with standard materials usable for the fabrication of integrated circuits.

What is claimed is:

1. A process, comprising:
    forming a layer of hydrogenated silicon nitride directly on a lower layer of copper that is supported by a carrier, wherein the layer of hydrogenated silicon nitride has, in a vicinity of an upper side, a ratio of a number of silicon atoms per cubic centimeter to a number of nitrogen atoms per cubic centimeter that is lower than 0.8;
    forming a layer of silicon oxide directly on the layer of hydrogenated silicon nitride; and
    forming an upper layer of copper directly on the layer of silicon oxide.

2. The process according to claim 1, wherein the layer of hydrogenated silicon nitride has, in the vicinity of the upper side, a number of silicon-hydrogen bonds smaller than or equal to $6 \times 10^{21}$ bonds per cubic centimeter.

3. The process according to claim 1, wherein the layer of hydrogenated silicon nitride has, in the vicinity of the upper side, a compressive mechanical stress having an intensity in absolute value higher than or equal to 1 GPa.

4. The process according to claim 1, wherein the layer of hydrogenated silicon nitride has, in the vicinity of the upper side, the number of silicon-hydrogen bonds smaller than $0.5 \times 10^{21}$ bonds per cubic centimeter.

5. The process according to claim 1, wherein the layer of hydrogenated silicon nitride has, in the vicinity of the upper side, the ratio of the number of silicon atoms per cubic centimeter to the number of nitrogen atoms per cubic centimeter lower than 0.6.

6. The process according to claim 1, wherein the vicinity of the upper side of the layer of hydrogenated silicon nitride comprises an upper portion of the layer of hydrogenated silicon nitride within a depth of less than about 50 nm from the upper side.

7. A device, comprising:
    a carrier;
    a lower layer of copper above the carrier;
    a layer of hydrogenated silicon nitride directly in contact with the lower layer of copper, wherein the layer of hydrogenated silicon nitride has, in a vicinity of an upper side, a ratio of a number of silicon atoms per cubic centimeter to a number of nitrogen atoms per cubic centimeter that is lower than 0.8;
    a layer of silicon oxide directly in contact with the layer of hydrogenated silicon nitride; and
    an upper layer of copper directly in contact with the layer of silicon oxide.

8. The device according to claim 7, wherein the layer of hydrogenated silicon nitride has, in the vicinity of the upper side, a number of silicon-hydrogen bonds smaller than or equal to $6 \times 10^{21}$ bonds per cubic centimeter.

9. The device according to claim 7, wherein the layer of hydrogenated silicon nitride has, in the vicinity of the upper side, a compressive mechanical stress having an intensity in absolute value higher than or equal to 1 GPa.

10. The device according to claim 7, wherein the layer of hydrogenated silicon nitride has, in the vicinity of the upper side, a number of silicon-hydrogen bonds smaller than $0.5 \times 10^{21}$ bonds per cubic centimeter.

11. The device according to claim 7, wherein the layer of hydrogenated silicon nitride has, in the vicinity of the upper side, a ratio of the number of silicon atoms per cubic centimeter to the number of nitrogen atoms per cubic centimeter lower than 0.6.

12. The device according to claim 7, wherein the lower layer of copper, the hydrogenated silicon nitride layer, the silicon oxide layer and the copper layer form a stack of layers defining a resonant optical filter.

13. The device according to claim 12, further comprising a photosensitive region of the carrier positioned underneath the resonant optical filter.

14. A process, comprising:
    forming a layer of hydrogenated silicon nitride on a carrier, wherein the layer of hydrogenated silicon nitride has, in a vicinity of an upper side, a compressive mechanical stress having an intensity in absolute value higher than or equal to 1 GPa;
    forming a layer of silicon oxide on the layer of hydrogenated silicon nitride; and
    forming a layer of copper on the layer of silicon oxide.

15. The process of claim 14, wherein the layer of hydrogenated silicon nitride has, in the vicinity of the upper side, a ratio of a number of silicon atoms per cubic centimeter to a number of nitrogen atoms per cubic centimeter that is lower than 0.6.

16. The process of claim 14, wherein the layer of hydrogenated silicon nitride has, in the vicinity of the upper side, a number of silicon-hydrogen bonds smaller than or equal to $6 \times 10^{21}$ bonds per cubic centimeter.

17. The process of claim 14, wherein forming the layer of hydrogenated silicon nitride comprises forming the layer of hydrogenated silicon nitride on a lower layer of copper that is supported by said carrier.

18. The process of claim 14, wherein the vicinity of the upper side of the layer of hydrogenated silicon nitride comprises an upper portion of the layer of hydrogenated silicon nitride within a depth of less than about 50 nm from the upper side.

19. A device, comprising:
a carrier;
a layer of hydrogenated silicon nitride supported by the carrier, wherein the layer of hydrogenated silicon nitride has, in a vicinity of an upper side, a compressive mechanical stress having an intensity in absolute value higher than or equal to 1 GPa;
a layer of silicon oxide on the layer of hydrogenated silicon nitride; and
a layer of copper on the layer of silicon oxide.

20. The device of claim 19, wherein the layer of hydrogenated silicon nitride has, in the vicinity of the upper side, a ratio of the number of silicon atoms per cubic centimeter to the number of nitrogen atoms per cubic centimeter that is lower than 0.6.

21. The device of claim 19, wherein the layer of hydrogenated silicon nitride has, in the vicinity of the upper side, a number of silicon-hydrogen bonds smaller than or equal to $6 \times 10^{21}$ bonds per cubic centimeter.

22. The device of claim 19, further comprising a lower layer of copper located under the layer of hydrogenated silicon nitride and above the carrier.

23. The device of claim 22, wherein the lower layer of copper, the hydrogenated silicon nitride layer, the silicon oxide layer and the copper layer form a stack of layers defining a resonant optical filter.

24. The device of claim 23, further comprising a photosensitive region of the carrier positioned underneath the resonant optical filter.

\* \* \* \* \*